United States Patent
Segawa et al.

(10) Patent No.: US 6,436,747 B1
(45) Date of Patent: Aug. 20, 2002

(54) METHOD OF FABRICATING SEMICONDUCTOR DEVICE

(75) Inventors: Mizuki Segawa, Osaka; Michikazu Matsumoto, Kyoto; Masahiro Yasumi, Osaka, all of (JP)

(73) Assignee: Matsushita Electtric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/551,541

(22) Filed: Apr. 18, 2000

(30) Foreign Application Priority Data

Apr. 21, 1999 (JP) ............................................. 11-113541

(51) Int. Cl.[7] ..................... H01L 21/336; H01L 21/8234
(52) U.S. Cl. ........................ 438/197; 438/142; 438/236; 438/532; 438/628
(58) Field of Search ................................. 438/197, 142, 438/234, 236, 491, 528, 532, 585, 659, 966, 682, 655, 666, 592, 305

(56) References Cited

U.S. PATENT DOCUMENTS

| | | | | |
|---|---|---|---|---|
| 4,818,711 A | * | 4/1989 | Choski et al. | 438/491 |
| 5,343,064 A | * | 8/1994 | Spangler et al. | 257/350 |
| 5,807,787 A | * | 9/1998 | Fu et al. | 438/623 |
| 5,998,288 A | * | 12/1999 | Gardner et al. | 438/589 |
| 6,087,234 A | * | 7/2000 | Wu | 438/299 |
| 6,159,784 A | * | 12/2000 | Ammo et al. | 438/234 |
| 6,303,962 B1 | * | 10/2001 | Gardner et al. | 257/347 |

FOREIGN PATENT DOCUMENTS

| | | | | |
|---|---|---|---|---|
| JP | 5-090417 | 4/1993 | | |
| JP | 5-226593 | 9/1993 | | |
| JP | 6-077474 | 3/1994 | | |
| JP | 6-310666 | 11/1994 | | |
| JP | 4-08111388 A | * | 4/1996 | ......... H01L/21/225 |
| JP | 10-303316 | 11/1998 | | |
| JP | 11-102970 | 4/1999 | | |

OTHER PUBLICATIONS

Japanese Office Action (with English translation), "Notice of Reasons of Rejection", Mailing date: Jan. 15, 2002.

* cited by examiner

Primary Examiner—Matthew Smith
Assistant Examiner—Igwe U. Anya
(74) Attorney, Agent, or Firm—Eric J. Robinson; Nixon Peabody LLP

(57) ABSTRACT

After phosphorus is ion implanted into a portion of a polysilicon film, first RTA is performed. After boron is ion implanted into another portion of the polysilicon film, the polysilicon film is patterned to form a gate electrode and a resistor film. A TEOS film is deposited and patterned to form a silicidation mask having an opening corresponding to a silicidation region. Thereafter, annealing for activating boron is performed in an atmosphere containing oxygen, thereby forming oxide films on a gate electrode and on heavily doped source/drain regions in the silicidation region. The oxide films suppress out-diffusion of the impurities and inhibit the impurity ions from penetrating the gate electrode 8 during ion implantation for promoting silicidation, which is performed subsequently.

17 Claims, 9 Drawing Sheets

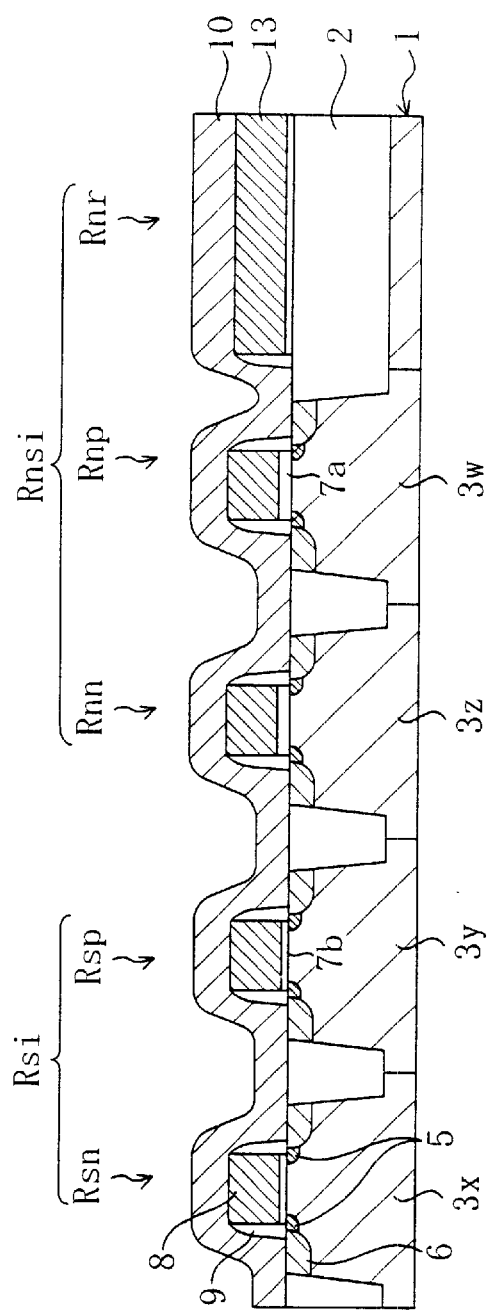
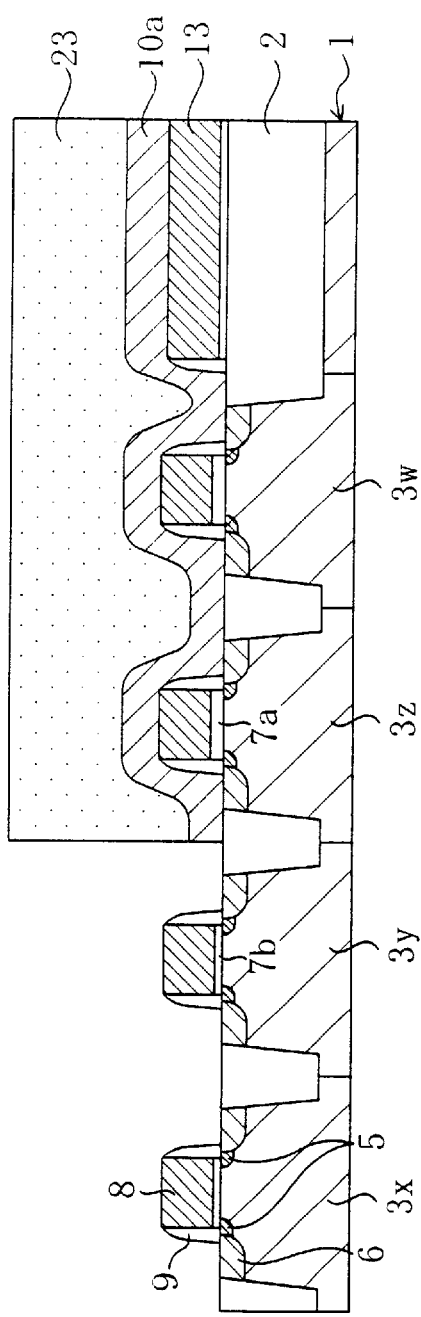
Fig. 3a
Fig. 3b

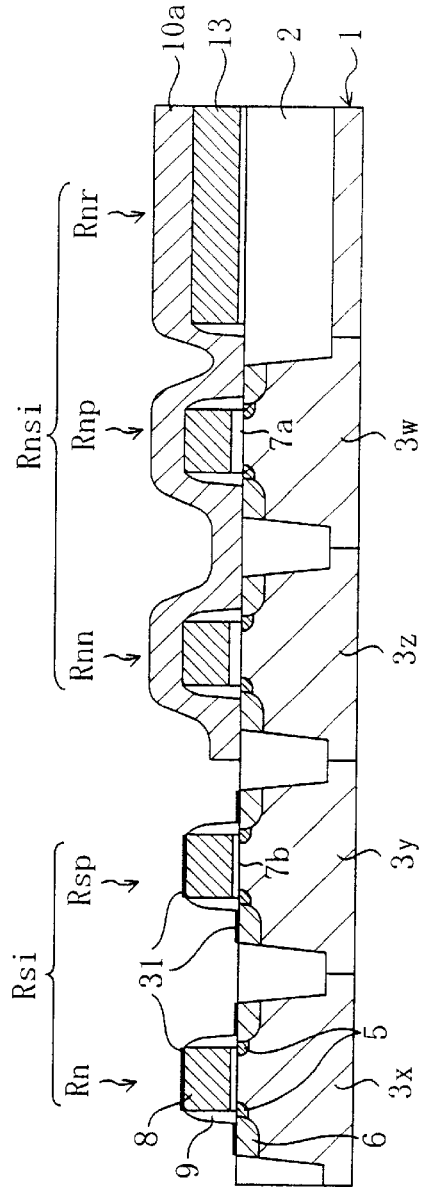
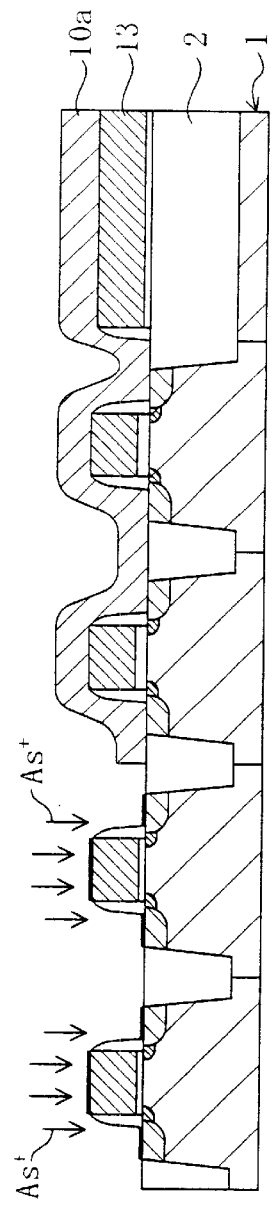
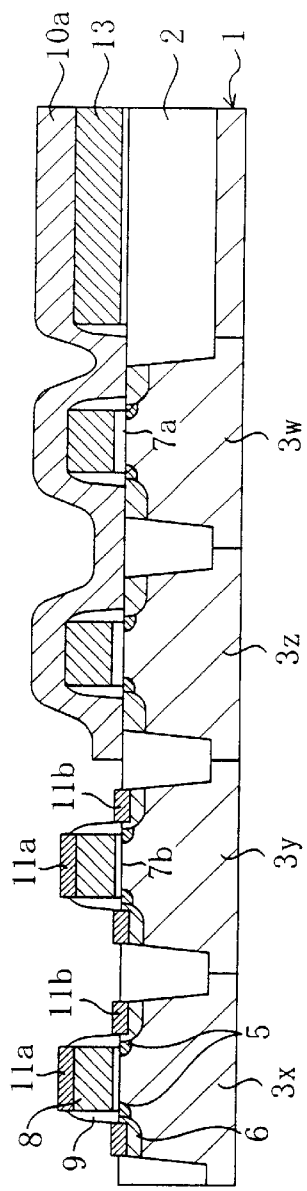
Fig. 4a
Fig. 4b
Fig. 4c

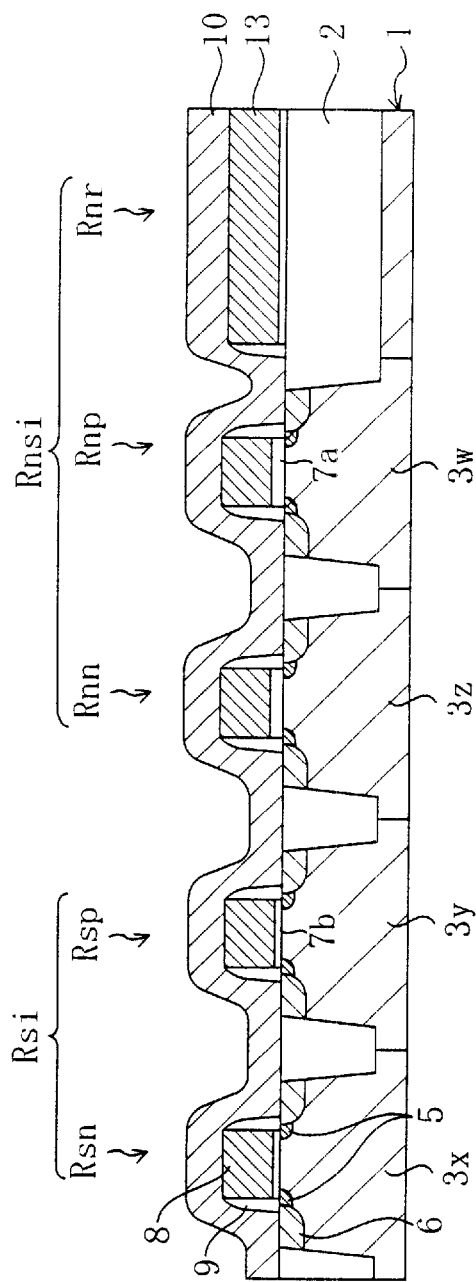
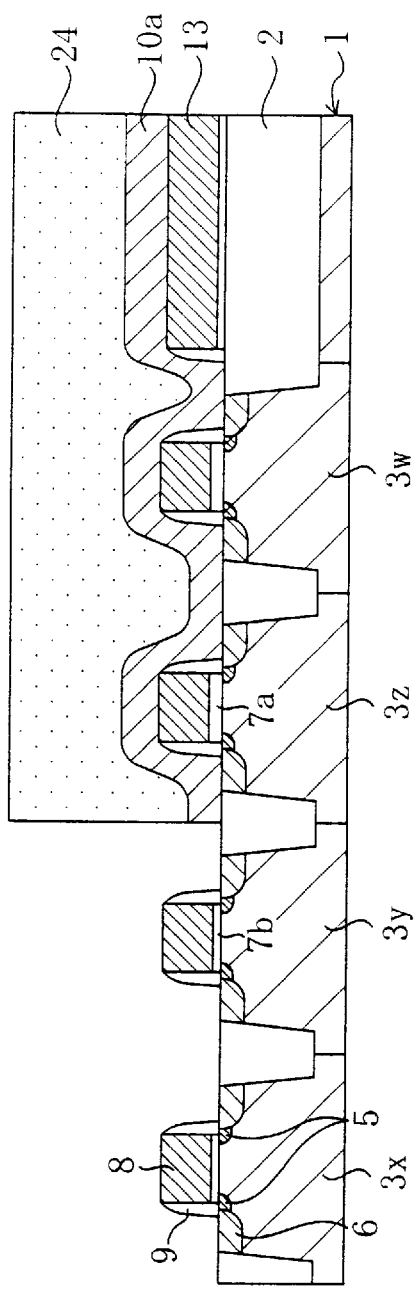
Fig. 8a
Fig. 8b

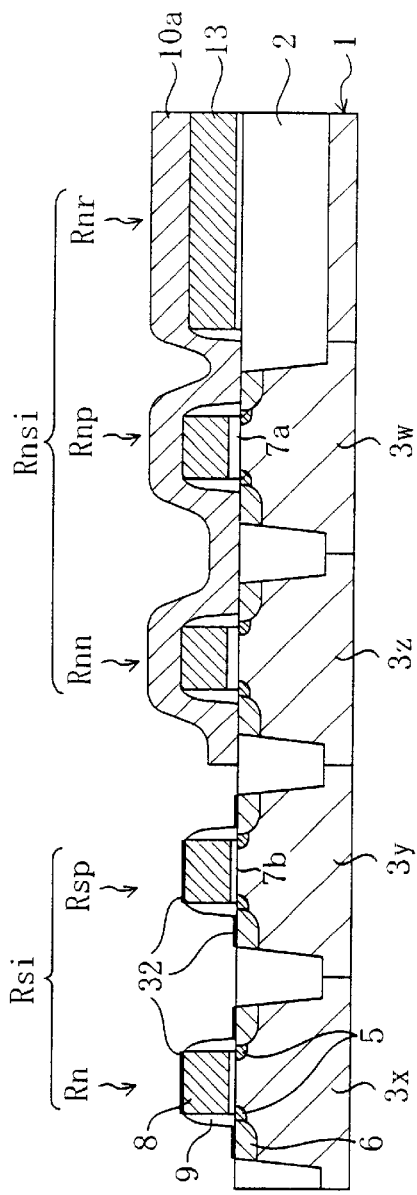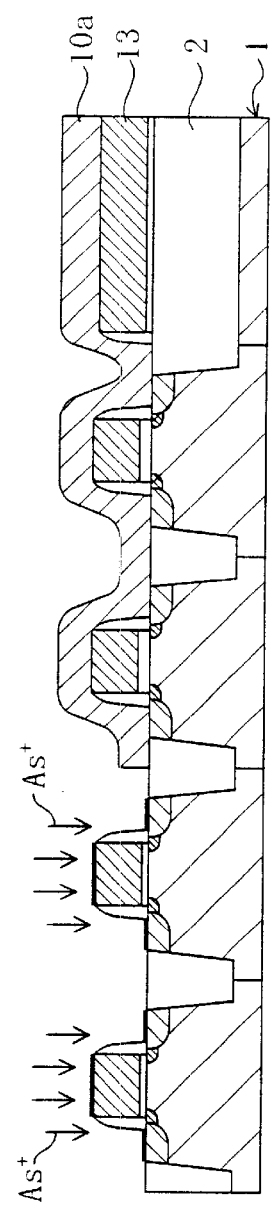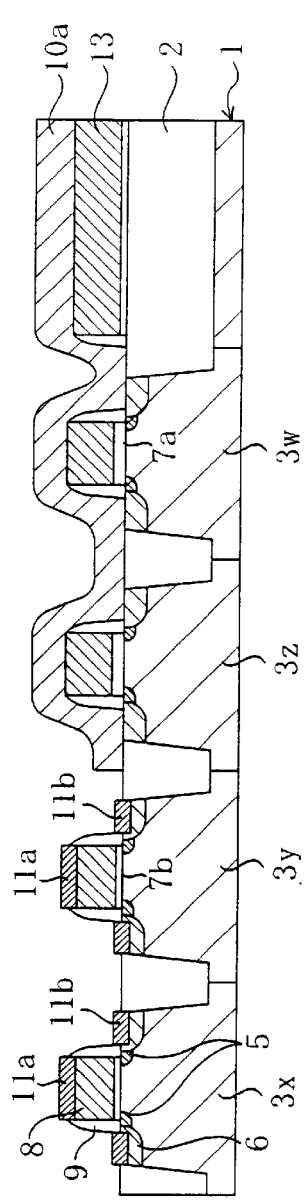

METHOD OF FABRICATING SEMICONDUCTOR DEVICE

BACKGROUND OF THE INVENTION

The present invention relates to a method of fabricating a semiconductor device having a polysilicon member formed by patterning a polysilicon film.

There have conventionally been known an element having a polysilicon member which should be silicided such as the gate electrode of a MOS transistor or the electrode of a capacitor and a semiconductor device having a polysilicon member which need not be silicided such as the resistor film of a resistor or the gate electrode of a high-breakdown-voltage transistor having a protective function against dielectric breakdown.

A description will be given to a conventional method of fabricating, as a conventional semiconductor device, a semiconductor device having a MOS transistor comprising a gate electrode which should be silicided and a high-breakdown-voltage MOS transistor which need not be silicided.

First, a non-doped polysilicon film is formed on a substrate. Then, distinct portions of the polysilicon film are doped with phosphorus as an n-type impurity and boron as a p-type impurity by ion implantation, resulting in separately implanted regions. The doping may be performed before or after the formation of the gate electrode of each of the transistors. If the resistance is to be reduced by using, as a dopant, an impurity at a particularly high concentration, the doping may be performed twice before and after the patterning of the polysilicon film.

Next, annealing (RTA) for activating the implanted impurities is performed. Then, a TEOS film for forming a selective etching mask is deposited over the entire surface of the substrate by a plasma process. The TEOS film is patterned by etching or the like to form the selective etching mask covering a non-silicidation region and having an opening corresponding to a silicidation region.

Next, an impurity for promoting silicidation (for preamorphization) are ion implanted, from above the selective etching mask, into a gate electrode as a polysilicon member in the silicidation region. In the case of a salicidation process, an impurity for promoting silicidation are also ion implanted into source/drain regions.

Thereafter, a refractory metal film is deposited on the substrate such that a reaction is caused between the metal composing the refractory metal film and polysilicon composing the gate electrode (in the case of the salicidation process, polysilicon composing the gate electrode and silicon composing the source/drain regions) to form a silicide film. At this time, the silicide film is not formed in the non-silicidation region where the selective etching mask is interposed between the refractory metal film, the gate electrode, and the source/drain regions. After etching away an unreacted portion of the refractory metal film, a heat treatment for the phase transition of the silicide film is performed.

The foregoing process forms a semiconductor device in which a MOS transistor comprising a polysilicon electrode having a silicided upper portion and a high-breakdown-voltage transistor having a non-silicided gate electrode are provided on a single substrate.

Oftentimes, the polysilicon resistor film of the resistor is formed on an insulating film for isolation in the non-silicidation region. In that case, it follows that the selective etching mask covers the top surface of the polysilicon resistor film in the aforementioned structure.

However, the semiconductor device formed by the conventional fabrication process has the following problems.

First, there are cases where the resistance of the polysilicon film, e.g., the gate resistance of the gate electrode of a MOS transistor or the resistance of the resistive element of a resistor, varies disadvantageously. This is because the impurity implanted in the gate electrode diffuses into an ambient atmosphere (out-diffusion) during a heat treatment for activation. Accordingly, the concentration of the impurity in the polysilicon film doped with the impurity is reduced so that the resistance becomes higher than a preset value.

Second, the threshold voltage of the MOS transistor, especially the MOS transistor formed in the silicidation region, varies due to penetration of the impurity implanted for promoting silicidation through the gate electrode and into the substrate.

Third, the resistance varies due to formation of voids after the impurity in the polysilicon member comes out during the annealing for activation. In addition, voids are also formed in the silicide film when the upper portion of the polysilicon member is silicided, which makes it impossible to sufficiently reduce the resistance of the silicide film.

SUMMARY OF THE INVENTION

A first object of the present invention is to provide a method of fabricating a semiconductor device having respective polysilicon members disposed in a silicidation region and in a non-silicidation region, wherein the resistance of each of the polysilicon members and the threshold voltage of a MOS transistor have reduced variations.

A second object of the present invention is to suppress an increase in the resistance of a silicide film by providing a semiconductor device having a polysilicon member with means for suppressing the formation of voids in the polysilicon member due to out-diffusion of an impurity.

A first method of fabricating a semiconductor device having a silicidation region and a non-silicidation region, wherein a MOS transistor comprising a gate electrode and heavily doped source/drain regions each having a silicided upper portion is disposed in the silicidation region, while an element comprising a polysilicon member having a non-silicided upper portion is disposed in the non-silicidation region, the method comprising the steps of: (a) forming a-gate insulating film and a polysilicon film on a semiconductor substrate; (b) implanting ions of an n-type impurity for resistance reduction into a portion of the polysilicon film by using a mask having an opening corresponding to an n-type impurity implantation region; (c) performing a first heat treatment for activating the n-type impurity; (d) after the step (c), implanting ions of a p-type impurity for resistance reduction into another portion of the polysilicon film by using a mask having an opening corresponding to a p-type impurity implantation region; (e) after the step (d), patterning the polysilicon film to form a gate electrode of the MOS transistor in the silicidation region and the polysilicon member in the non-silicidation region; (f) implanting impurity ions for forming the heavily doped source/drain regions of the MOS transistor; (g) after the step (f), forming an insulating film on the substrate; (h) forming a selective etching mask on the insulating film; (i) patterning the insulating film by using the selective etching mask to form a silicidation mask, the mask covering the non-silicidation region and having an opening over the silicidation region; (j) after the step (i), performing a second heat treatment for activating the p-type impurity; (k) after the step (j), implanting impurity ions for promoting silicidation into the gate electrode and heavily doped source/drain regions of the MOS transistor in the silicidation region; and (l) after the step (k), siliciding the respective upper portions of the gate electrode and heavily doped source/drain regions of the MOS transistor in the silicidation region.

In accordance with the method, the region heavily doped with the n-type impurity can be eliminated by the first heat treatment and the out-diffusion of the impurity implanted in the polysilicon member in the non-silicidation region can be prevented in the second heat treatment. This surely prevents variations in the resistance of the polysilicon member (such as the resistor film of a resistor) disposed in the non-silicidation region. Moreover, an increase in fabrication cost can be circumvented since the number of process steps is not increased.

In the first method of fabricating a semiconductor device, the first heat treatment is performed in an atmosphere containing oxygen, whereby oxide films are formed on the regions of the polysilicon film implanted with an n-type impurity, so that the out-diffusion of then-type impurity is suppressed during the heat treatment. As a consequence, variations in the resistance of the polysilicon film due to out-diffusion of the n-type impurity and variations in the resistance of the polysilicon film due to voids left as a result of out-diffusion of the n-type impurity are suppressed.

Preferably, a partial pressure of oxygen in the atmosphere containing oxygen in the first heat treatment is 5 to 30%.

In the first method of fabricating a semiconductor device, the second heat treatment is performed in an atmosphere containing oxygen, whereby oxide films are formed on the gate electrode and on the heavily doped source/drain regions which are exposed in the silicidation region, so that the out-diffusion of the n-type impurity in these regions is suppressed. As a consequence, variations in the resistances of these regions are suppressed. In the presence of the oxide film, variations in the threshold voltage of the MOS transistor due to penetration of the impurity ions for promoting silicidation through the gate electrode and into the semiconductor device in the subsequent step (k) are suppressed.

Preferably, a partial pressure of oxygen in the atmosphere containing oxygen in the second heat treatment is 5 to 30%.

In the step (h) of the first method of fabricating a semiconductor device, the selective etching mask is formed of a resist film, the method further comprising the step of: after the step (i) and prior to the step (j), removing the resist film by ashing using an oxygen plasma. As a result, oxide films can be formed on the gate electrode and on the heavily doped source/drain regions, while the resist film is removed. Consequently, variations in the resistances of the gate electrode and the heavily doped source/drain regions as described above and variations in the threshold voltage of the MOS transistor in the silicidation region are suppressed.

In the step (h) of the first method of fabricating a semiconductor device, the selective etching mask is formed of a resist film, the method further comprising the step of: after the step (i) and prior to the step (j), removing the resist film by using an aqueous solution of sulfuric acid and hydrogen peroxide and plasma oxidizing the respective surface portions of the gate electrode and the heavily doped source/drain regions in the silicidation region. As a result, oxide films can be formed on the gate electrode and on the heavily doped source/drain regions. Consequently, variations in the resistances of the gate electrode and the heavily doped source/drain regions as described above and variations in the threshold voltage of the MOS transistor in the silicidation region are suppressed.

In the step (b) of the first method of fabricating a semiconductor device, at least one of a resistor film of a resistor and a gate electrode of a high-breakdown-voltage transistor can be formed as the polysilicon member of the element in the non-silicidation region.

A second method of fabricating a semiconductor device according to the present invention comprises the steps of:(a) implanting ions of an impurity for resistance reduction into a polysilicon layer on a semiconductor substrate; and (b) performing a heat treatment with respect to the substrate in an atmosphere containing oxygen.

In accordance with the method, an oxide film is formed on he polysilicon film so that the out-diffusion of the impurity is suppressed during the heat treatment. As a consequence, variations in the resistance of the polysilicon layer due to out-diffusion of the impurity and variations in the resistance of the polysilicon layer due to voids left as a result of out-diffusion of the impurity are suppressed.

In the second method of fabricating a semiconductor device, if the polysilicon layer is a gate electrode of a MOS transistor, the method further comprises the steps of: (c) after the step (b), implanting an impurity for promoting silicidation into the polysilicon layer; and (d) after the step (c), siliciding an upper portion of the polysilicon layer. In addition to the foregoing effects, there is achieved the effect of inhibiting the impurity from penetrating the gate electrode during ion implantation for preamorphization in the case of performing the siliciding step thereafter. As a result, variations in the threshold voltage of the MOS transistor are suppressed.

In the second method of fabricating a semiconductor device, if the polysilicon layer is a resistive element of a resistor, the resistance of the resistor film can be maintained accurately within the permissible range by suppressing out-diffusion of the impurity.

BRIEF DESCRIPTION OF THE DRAWINGS

FIGS. 3(a) and (b) are cross-sectional views illustrating the mid stage of the process of fabricating a semiconductor device according to the second embodiment of the present invention;

FIGS. 4(a) to (c) are cross-sectional views illustrating the late stage of the process of fabricating a semiconductor device according to the second embodiment of the present invention;

FIGS. 8(a) and (b) are cross-sectional views illustrating the mid stage of the process of fabricating a semiconductor device according to a third embodiment of the present invention; and FIGS. 9(a) to (c) are cross-sectional views illustrating the late stage of the process of fabricating a semiconductor device according to the third embodiment of the present invention.

DETAILED DESCRIPTION OF THE INVENTION

EMBODIMENT 1

Figure 1A:
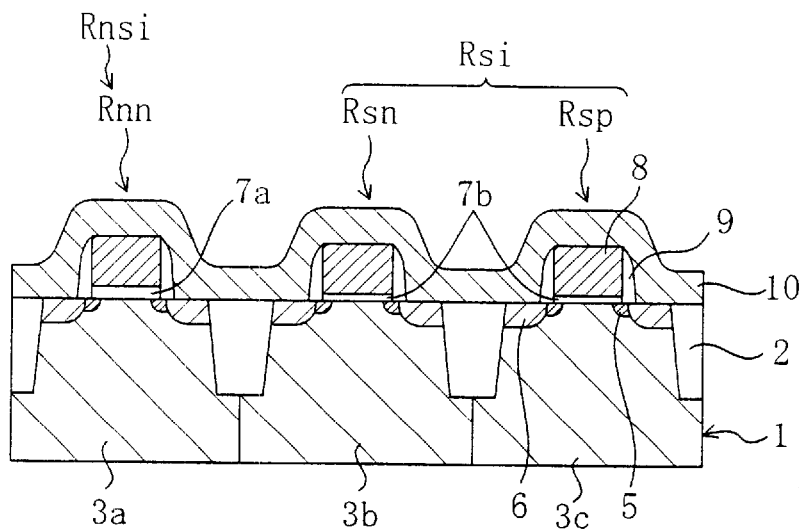
FIGS. 1(a) to (c) are cross-sectional views illustrating the process of fabricating a semiconductor device according to a first embodiment of the present invention.
Figure 1B:
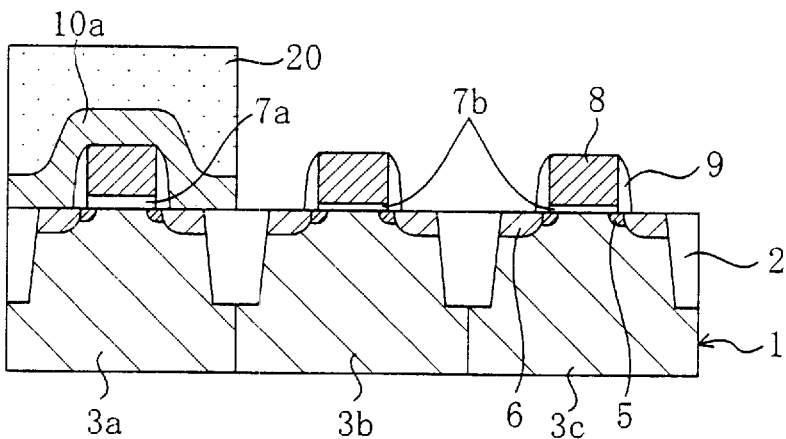
Figure 1C:
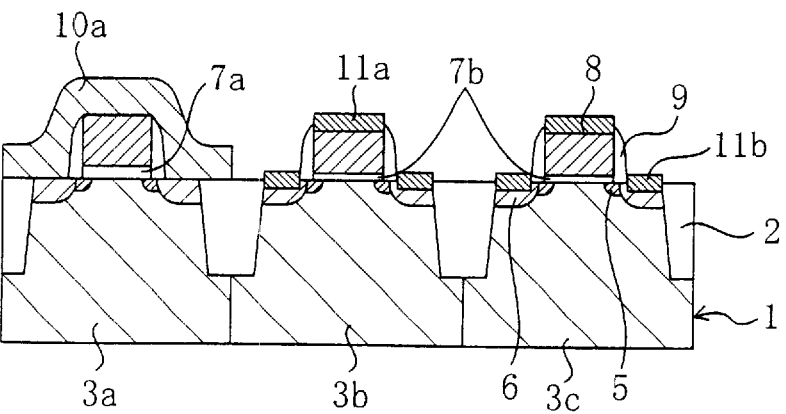

FIGS. 1(a) to (c) are cross-sectional views illustrating the process of fabricating a semiconductor device according to the present invention.

Prior to the step shown in FIG. 1(a), the process is performed by the following procedure. First, a trench insulating film 2 for isolation is formed in a Si substrate 1 to surround each transistor formation region. The insulating film 2 for isolation is formed by, e.g., the following process. After a protective oxide film and a silicon nitride film are formed on a substrate, the trench formation regions of the protective oxide film and the silicon nitride film are removed selectively. The Si substrate 1 is etched by using the remaining portion of the silicon nitride film as an etching mask, whereby a trench is formed. Thereafter, a silicon oxide film is deposited on the substrate and filled in the trench by performing CMP till the silicon nitride film is exposed, thereby forming the insulating film 2 for isolation. As a result, the Si substrate 1 is roughly divided 5 into a silicidation region Rsi and a non-silicidation region Rnsi by the insulating film 2 for isolation. In the non-silicidation region Rnsi, there is provided a high-breakdown-voltage nMOSFET formation region Rnn for forming a high-breakdown-voltage n-channel MOS transistor to be disposed in an input circuit. The silicidation region Rsi is subdivided into an nMOSFET formation region Rsn for forming an n-channel MOS transistor and a pMOSFET formation region Rsp for forming a p-channel MOS transistor. Subsequently, impurity ions are implanted into each of the regions Rnn, Rsn, and Rsp such that well regions 3a, 3b, and 3c in accordance with the transistors to be formed in the respective regions are formed. Specifically, the p-type well region 3a, the p-type well region 3b, and the n-type well region 3c are formed in the high-breakdown-voltage nMOSFET formation region Rnn, the nMOSFET formation region Rsn, and the pMOSFET formation region Rsp, respectively.

Although the high-breakdown-voltage nMOS transistor disposed in the input circuit is typically only the n-channel MOS transistor in most cases, there are cases where both the n-channel MOS transistor and a p-channel MOS transistor are provided.

Next, on the region of the Si substrate 1 surrounded by the insulating film 2 for isolation, gate oxide films 7a and 7b each composed of a silicon oxide film (thermal oxide film) and a polysilicon film are formed successively. At this stage, polysilicon has not been doped yet. In general, the gate oxide film 7a of the high-breakdown-voltage transistor formed in the non-silicidation region Rnsi is thicker than the gate oxide film 7b of the normal MOSFET formed in the silicidation region Rsi. For instance, the thickness of the gate oxide film 7a of the normal MOS transistor is on the order of 5 nm, while the thickness of the gate oxide film 7b of the high-breakdown-voltage MOS transistor is about 10 nm.

Next, the polysilicon film is doped with phosphorus as an n-type impurity by ion implantation, while the portion of the polysilicon film located in the pMOSFET formation region Rsp is covered with a resist film. At this time, the high-breakdown-voltage nMOSFET formation region Rnn in the non-silicidation region Rnsi is also doped with phosphorus by ion implantation. Thereafter, annealing for activating phosphorus (first RTA) is performed.

Next, the polysilicon film is doped with boron as a p-type impurity by ion implantation, while the portions of the polysilicon film located in the nMOSFET formation region Rsn and in the high-breakdown-voltage nMOSFET formation region Rnn are covered with a resist mask. Annealing for activating boron (second RTA) is not performed herein.

Then, the polysilicon film is patterned to form the respective gate electrodes 8 of the n-channel and p-channel MOS transistors and of the high-breakdown-voltage MOS transistor. Subsequently, ion implantation of an impurity for forming LDD regions 5, formation of sidewalls 9 composed of silicon oxide films, and ion implantation of an impurity for forming heavily doped source/drain regions 6 are performed successively.

Then, as shown in FIG. 1 (a), a TEOS film 10 is deposited over the entire surface of the substrate by plasma CVD, whereby the non-silicidation region Rnsi and the silicidation region Rsi are entirely covered with the TEOS film 10.

Thereafter, annealing (RTA process) for activating boron in the gate electrode of the p-channel MOS transistor is performed at a temperature of 750° C. for 5 seconds.

Next, in the step shown in FIG. 1(b), a resist mask 20 for covering the non-silicidation region Rnsi is formed on the substrate by a photolithographic process. Wet etching is performed with respect to the TEOS film 10 by using the resist mask 20 as an etching mask, thereby leaving the portion of the TEOS film 10 located in the non-silicidation region Rnsi as a TEOS mask 10a and removing the other portion thereof. As a result, respective surfaces of the gate electrodes 8 and the heavily doped source/drain regions 6 of the MOSFET in the silicidation region Rsi are exposed. It is to be noted that hydrofluoric acid is used as a wet etching solution.

Next, the respective surface portions of the gate electrodes 8 and the heavily doped source/drain regions 6 are preamorphized for easy silicidation of the surface portions of these regions. Specifically, after the resist mask 20 is removed, arsenic ions ($As^+$) are implanted from above the TEOS mask 10a into the gate electrodes 8 and into the heavily doped source/drain regions 6 at a dose of $1 \times 10^{14}$ $cm^{12}$ and an implant energy of about 20 keV. As a result, the near-surface regions of the gate electrodes 8 and the heavily doped source/drain regions 6 are amorphized and silicide is more likely to be formed.

Next, in the step shown in FIG. 1(c), a metal film composed of titanium (or a cobalt film) having a thickness of 50 nm is deposited over the entire surface of the substrate. At this time, a sputtering method using titanium (or cobalt) as a target is adopted.

Next, a heat treatment is performed at 650° C. for 30 minutes to cause reactions among titanium (or cobalt), polysilicon composing the gate electrodes 8, and monocrystalline silicon composing the heavily doped source/drain regions 6, thereby siliciding the respective surface portions of the gate electrode 8 and the heavily doped source/drain regions 6 and forming the titanium silicide films 11a and 11b.

Thereafter, the TEOS mask 10a is removed so that a semiconductor device is obtained in which the highbreakdown-voltage nMOSFET is disposed in the non-silicidation region Rnsi and the normal nMOSFET and pMOSFET are disposed in the silicidation region Rsi.

The present embodiment has changed the conventional sequence of the annealing step (second RTA) for impurity activation in the portion of the polysilicon film for gate, which will form the gate electrode of the normal p-channel MOS transistor, and the step of forming the TEOS film 10. In short, the annealing (first RTA) for activating phosphorus in the portions of the polysilicon film for gate, which will form the gate electrodes of the normal nMOSFET and the high-breakdown-voltage nMOSFET, is performed prior to the deposition of the TEOS film 10. As a result of the implantation of the n-type impurity ions (phosphorus ions), a portion containing the n-type impurity at an extremely high concentration is present in the surface portion of the polysilicon film in the nMOSFET formation region Rnn. If the gate electrode or the like is formed by etching the polysilicon film in this condition, the etching effect is promoted more in the portion containing the n-type impurity at an extremely high concentration than in the other portion, which may degrade anisotropy and produce a side etched portion in the upper end portion of the gate electrode or the like. In the present embodiment, however, the first RTA causes the n-type impurity to diffuse from the portion of the polysilicon film 12 containing the n-type impurity (phosphorus) at an extremely high concentration adjacent the surface thereof into the interior of the polysilicon film. As a result, the concentration of the n-type impurity in the surface portion of the polysilicon film 12 is reduced. This prevents side etching in the upper end portion of the gate electrode when the gate electrode or the like is formed by etching the polysilicon film afterwards.

On the other hand, annealing (second RTA) for impurity diffusion is not formed immediately after the implantation of boron as the p-type impurity into the polysilicon film but is performed with the TEOS film 10 covering the entire surface of the substrate. This suppresses variations in the gate resistance of the normal p-channel MOS transistor due to out-diffusion of the impurity in the second RTA. As a result, a semiconductor device having stable electric properties is provided.

EMBODIMENT 2

FIGS. 2(*a*) to (*c*), FIGS. 3(*a*) and (*b*), and FIGS. 4(*a*) to (*c*) are cross-sectional views illustrating the process of fabricating a semiconductor device according to a second embodiment of the present invention.

Prior to the step shown in FIG. 2(*a*), the process is performed first by the following procedure. First, a trench insulating film 2 for isolation is formed in a Si substrate 1 to surround each transistor formation region. The insulating film 2 for isolation is formed by the same procedure as described in the first embodiment. The Si substrate 1 is roughly divided into a silicidation region Rsi and a non-silicidation region Rnsi by the insulating film 2 for isolation. In the present embodiment, the non-solicidation region Rnsi is subdivided into a high-breakdown-voltage nMOSFET formation region Rnn in which a high-breakdown-voltage n-channel MOS transistor to be disposed in an input circuit is provided, a high-breakdown-voltage pMOSFET formation region Rnp in which a high-breakdown-voltage p-channel MOS transistor to be disposed in the input circuit is provided, and a resistor formation region Rnr overlying the insulating film 2 for isolation, in which a resistor to be disposed in the input circuit is provided. On the other hand, the silicidation region Rsi is subdivided into an nMOSFET formation region Rsn for forming an n-channel MOS transistor and a pMOSFET formation region Rsp for forming a p-channel MOS transistor. Thereafter, impurity ions are implanted into each of the regions Rsn, Rsp, Rnn, and Rnp such that well regions 3*x*, 3*y*, 3*z*, and 3*w* in accordance with the transistors formed in the respective regions are formed. Specifically, the p-type well regions 3*x* and 3*z* are formed in the nMOSFET formation region Rsn and in the high-breakdown-voltage nMOSFET formation region Rnn, while the n-type well regions 3*y* and 3*w* are formed in the pMOSFET formation region Rsp and in the high-breakdown-voltage pMOSFET formation region Rnp.

Next, gate oxide films 7*a* and 7*b* composed of silicon oxide films (thermal oxide films) and a polysilicon film 12 are formed successively on the region of the Si substrate 1 surrounded by the insulating film 2 for isolation. In general, the gate oxide film 7*a* of the high-breakdown-voltage transistor formed in the non-silicidation region Rnsi is thicker than the gate oxide film 7*b* of the normal MOSFET formed in the silicidation region Rsi. For instance, the thickness of the gate oxide film 7*a* of the normal MOS transistor is on the order of 5 nm, while the thickness of the gate oxide film 7*b* of the high-breakdown-voltage MOS transistor is about 10 nm.

Next, a resist film 21 covering the portions of the polysilicon film 12 located in the pMOSFET formation region Rsp, in the high-breakdown-voltage pMOSFET formation region Rnp, and in the resistor formation region Rnr and having openings over the portions of the polysilicon film located in the nMOSFET formation region Rsn and in the high-breakdown-voltage nMOSFET formation region Rnn is formed on the polysilicon film 12. By using the resist mask 21 as an implant mask, phosphorus ions (P$^+$) as n-type impurity ions are implanted into the polysilicon film 12. Briefly, the regions of the polysilicon film 12 included in the nMOSFET formation region Rsn and in the high-breakdown-voltage nMOSFET formation region Rnn are doped with phosphorus.

After the resist mask 21 is removed, annealing for activation (first RTA) is performed. The RTA process is performed in an atmosphere containing oxygen ($O_2$) and nitrogen ($N_2$) in the temperature range of 750 to 850° C. The partial pressure of oxygen is, e.g., 5 to 20%. Specifically, the partial pressure of oxygen can be adjusted by determining, e.g., a flow rate ratio between nitrogen and oxygen. At this stage, an extremely thin oxide film (silicon oxide film) 30 having a thickness of 3 to 4 nm is formed on the exposed portions of the polysilicon film 12. By forming the oxide film 30, phosphorus implanted in the polysilicon film 12 is inhibited from out-diffusion during the first RTA.

As a result of the implantation of the n-type impurity ions (phosphorus ions), portions containing the n-type impurity at extremely high concentrations are present in the surface portions in the respective regions Rsn and Rnn. If the gate electrode or the like is formed by etching the polysilicon film in this condition, the etching effect is promoted more in the portion containing the n-type impurity at an extremely high concentration than in the other portion, which may degrade anisotropy and produce a side etched portion in the upper end portion of the gate electrode or the like. In the present embodiment, however, the first RTA causes the n-type impurity to diffuse from the portion of the polysilicon film 12 containing the n-type impurity (phosphorus) at an extremely high concentration adjacent the surface thereof into the interior of the polysilicon film in each of the regions Rsn and Rnn). As a result, the concentration of the n-type impurity in the surface portion of the polysilicon film 12 is reduced. This prevents side etching in the upper end portion of the gate electrode when the gate electrode or the like is formed by etching the polysilicon film afterwards.

Figure 2A:
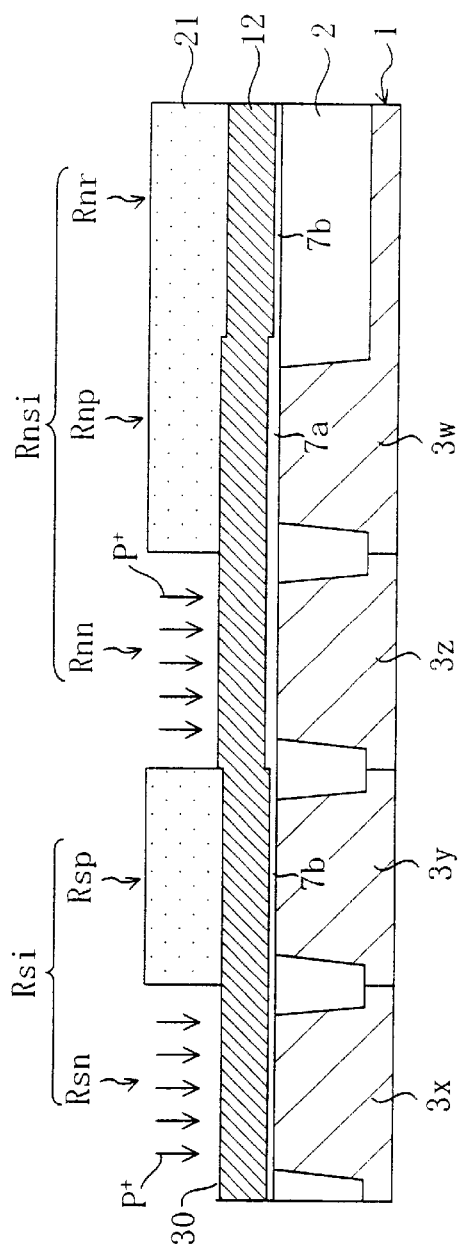
FIGS. 2(a) to (c) are cross-sectional views illustrating the early stage of the process of fabricating a semiconductor device according to a second embodiment of the present invention.
Figure 2B:
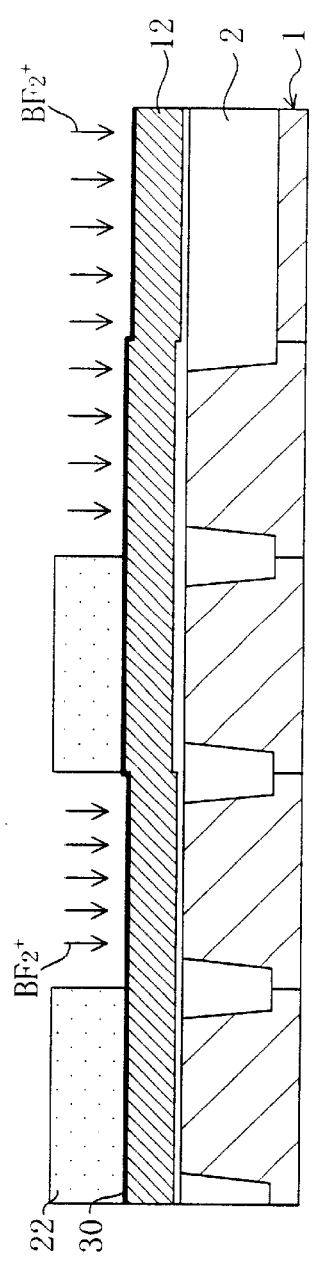

Next, in the step shown in FIG. 2(b), a resist mask 22 covering the portions of the polysilicon film 12 located in the nMOSFET formation region Rsn and in the high-breakdown-voltage nMOSFET formation region Rnn and having openings over the portions of the polysilicon film 12 located in the pMOSFET formation region Rsp, in the high-breakdown-voltage pMOSFET formation region Rnp, and in the resistor element formation region Rnr is formed on the polysilicon film 12. By using the resist mask 22 as an implant mask, boron fluoride ions ($BF_2^+$) as p-type impurity ions are implanted in the polysilicon film 12. Briefly, the regions of the polysilicon film 12 included in the pMOSFET formation region Rsp, in the high-breakdown-voltage PMOSFET formation region Rnp, and in the resistor formation region:Rnr are doped with boron. The annealing (second RTA) for activating boron is not performed herein.

Instead of the p-type impurity, an n-type impurity may also be ion implanted into the portion of the polysilicon film 12 located in the resistor formation region Rnr. In that case, an opening is formed in the portion of the resist mask 21 located in the resistor formation region Rnr in the state shown in FIG. 2(a). After the resist mask 21 is removed, an oxide film is formed on the polysilicon film 12 by the first RTA performed in an atmosphere containing oxygen. This suppresses out-diffusion of the n-type impurity and makes it possible to accurately maintain the resistance of the resistor in a permissible range.

Figure 2C:
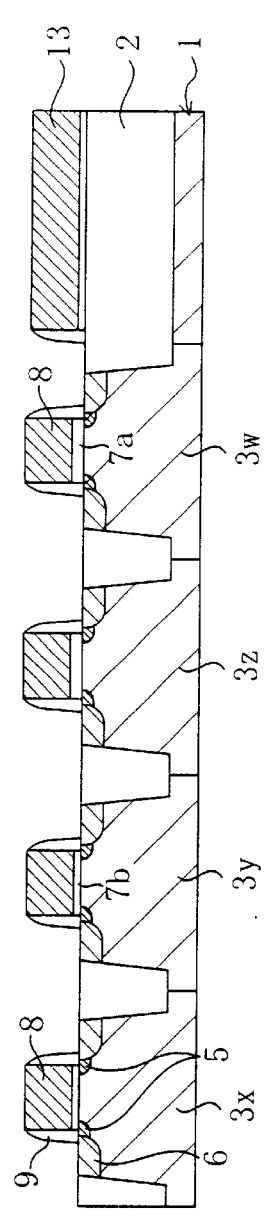

Next, in the step shown in FIG. 2(c), the resist mask 22 is removed and a mask (not shown) for forming gate electrodes and a resistor film is formed. The polysilicon film is patterned by using the formation mask as an etching mask, thereby forming the gate electrodes of the respective MOSFETs and the resistor film 13 of the resistor. Thereafter, the formation mask is removed and ion implantation of an impurity for forming LDD regions 5, formation of sidewalls 9 composed of silicon oxide films on the side surfaces of the gate electrodes 8, and ion implantation of an impurity for forming heavily doped source/drain regions 6 are performed successively. In the normal process, the oxide film formed on the polysilicon film 12 is removed by, e.g., an etch-back process for forming the sidewalls.

Next, in the step shown in FIG. 3(a), a TEOS 10 is deposited by plasma CVD on the entire surface of the substrate. Although the first embodiment has performed annealing immediately thereafter, the present embodiment will not perform annealing.

Next, in the step shown in FIG. 3(b), a resist mask 23 covering the non-silicidation-region Rnsi and having an opening over the silicidation region Rsi is formed on the TEOS film 10.

By using the resist mask 23 as an etching mask, wet etching is performed to remove the portion of the TEOS film 10 included in the silicidation region Rsi. As a result, a TEOS mask 10a having an opening corresponding to the silicidation region Rsi is formed and the respective surfaces of the source/drain regions 6 and the gate electrode of each of the MOS transistors in the silicide formation region Rsi are exposed.

Next, in the step shown in FIG. 4(a), the resist mask 23 is washed away with an aqueous sulfuric peroxide solution (sulfuric acid+hydrogen peroxide+water). After that, the second RTA process is performed in an atmosphere containing oxygen ($O_2$) and nitrogen ($N_2$) in the temperature range of 750 to 850° C. For instance, the partial pressure of oxygen ($O_2/(O_2+N_2)$) is 5 to 20%. Specifically, nitrogen and oxygen is allowed to flow at a flow rate ratio of $N_2:O_2=5:1$. As a result, oxide films 31 are formed on the portions uncovered with the TEOS mask 10a, i.e., on the gate electrodes 8 and source/drain regions 6 of the MOS transistors in the silicide formation region Rsi. The oxide films 31 suppress out-diffusion of the n-type impurity (phosphorus) and p-type impurity (boron) in the gate electrodes 8 of the n-channel and p-channel MOS transistors in the second RTA process, while suppressing the penetration of arsenic ions ($As^+$) during $As^+$ implantation during preamorphous formation performed subsequently.

Next, in the step shown in FIG. 4(b), ion implantation for preamorphizing the respective surface portions of the gate electrodes 8 and the heavily doped source/drain regions 6 in the silicidation region Rsi is performed for easy silicidation of the surface portions of the gate electrodes 8 and the heavily doped source/drain regions 6. Specifically, $As^+$ ions are implanted into the gate electrodes 8 and the heavily doped source/drain regions 6 by using the TEOS mask 10a as an implant mask at a dose of about $1\times10^{14}$ $cm^{-2}$ and an implant energy of about 20 keV. As a result, the respective near-surface regions of the gate electrodes 8 and the heavily doped source/drain regions 6 are amorphized and silicide is more likely to be formed. Since the dose for the ion implantation performed at this time is extremely low compared with the dose of ions implanted into the polysilicon film and the source/drain regions, the impurity implanted in the polysilicon film and the source/drain regions does not impair conductivity.

In addition, since an ion species implanted at this time is satisfactory provided that it has the function of amorphizing the regions to be silicided, ion implantation may also be performed by using not only $As^+$ but also ions of relatively large atoms such as Ge.

Next, in the step shown in FIG. 4(c), a metal film composed of titanium (or cobalt film) and having a thickness of 40 nm is deposited over the entire surface of the substrate. At this time, a sputtering method using titanium (or cobalt) as a target is adopted. Although the oxide films 31 are in most cases removed naturally, it is also possible to provide an additional step of removing the oxide films 31 by etching, high temperature retention in vacuum, or the like prior to sputtering.

Next, a heat treatment is performed at 650° C. for 30 minutes to cause reactions among titanium (or cobalt) composing the metal film, polysilicon composing the gate electrodes 8, and monocrystalline silicon composing the heavily doped source/drain regions 6, thereby siliciding the respective surface portions of the gate electrodes 8 and the heavily doped source/drain regions 6 and forming titanium silicide films 11a and 11b. Then, the unreacted metal film is removed.

The subsequent process is as described in the first embodiment. When the TEOS mask 10a is removed, n-channel and p-channel MOS transistors each comprising the gate electrode 8 and the heavily doped source/drain regions 6 having the respective surface portions thereof silicided are formed in the silicidation region Rsi. In the non-silicidation region Rnsi, high-breakdown-voltage n-channel and p-channel MOS transistors, each comprising the non-silicided gate electrode 8 and heavily doped source/drain regions 6, and the non-silicided resistor film 13 are formed.

Compared with the first embodiment, the present embodiment is characterized in that the first and second RTA processes are performed in an atmosphere containing oxygen and the ion implantation for preamorphization is performed after the TEOS mask 10a is formed by patterning the TEOS film 10. As a result, the following effects are achievable.

First, the oxide film 30 is formed on the polysilicon film 12 by performing the first RTA process in the atmosphere containing oxygen. Consequently, the out-diffusion of the n-type impurity is suppressed during the first RTA process. As a result, the deterioration of conductivity due to a reduction in the n-type impurity implanted in the polysilicon film can be prevented effectively. If the n-type impurity comes out of the polysilicon film, voids are formed in the polysilicon film so that the resistance of the polysilicon film is increased. Since the void portions are not silicided afterwards, the resistance of the silicide layer is also increased. That is, there is the general possibility of incurring the problem that the resistance of the polysilicon film varies. However, such a problem can also be solved by suppressing out-diffusion of the n-type impurity in the presence of the oxide film 30.

Second, the following effect can be achieved by performing the second RTA process in the atmosphere containing oxygen in addition to the effect of suppressing variations in the respective resistances of the gate electrodes and the heavily doped source/drain regions 6, which is achieved by suppressing out-diffusion of the n-type and p-type impurities. That is, the concentrations of the impurities initially implanted in the respective well regions 3x, 3y, 3z, and 3w for controlling the threshold values of the MOS transistors are extremely low compared with the impurity concentrations in the source/drain regions. It was found that, when $As^+$ penetrated the gate electrodes 8 to reach the channel regions in the Si substrate 1 during the ion implantation for preamorphization, the threshold voltages of the MOS transistors varied. By thus forming the oxide films 31 on the gate electrodes by the second RTA process according to the present embodiment, the ions ($As^+$) implanted for preamorphization are inhibited from penetrating the gate electrodes 8 (by channeling) and reaching the channel regions. Briefly, there can be prevented variations in threshold voltage resulting from impurity penetration in the n-channel MOS transistor formed in the silicidation region Rsi.

On the other hand, the out-diffusion of the n-type and p-type impurities is suppressed positively in the non-silicidation region Rnsi since the heat treatment is performed with the TEOS film mask 10a covering the non-silicidation region Rnsi.

Since only the n-type impurity of the impurities implanted in the polysilicon film 12 is activated by the first RTA process and the p-type impurity implanted in the polysilicon film 12 is not activated, the p-type impurity is inhibited from diffusing and entering the gate oxide films 7a and 7b and the Si substrate 1. This prevents the deterioration of the conductivity of the gate electrode 8 of each of the p-channel MOS transistor and the high-breakdown-voltage p-channel MOS transistor, the degradation of the insulating properties of the gate oxide films 7a and 7b, and variations in threshold voltage.

A description will be given to data related to the effects of performing the RTA process in the atmosphere containing oxygen.

Figure 5A:
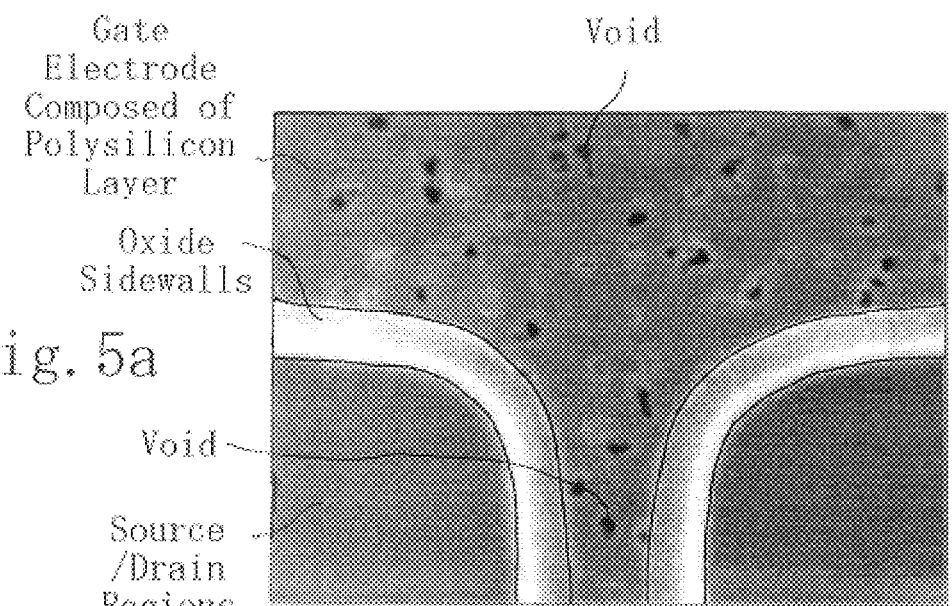
FIGS. 5(a) to (c) are photocopies of SEM images on the top surfaces of samples that have been subjected to RTA processes performed under three different conditions to verify the effects of the RTA processes in oxygen-containing atmospheres.
Figure 5B:
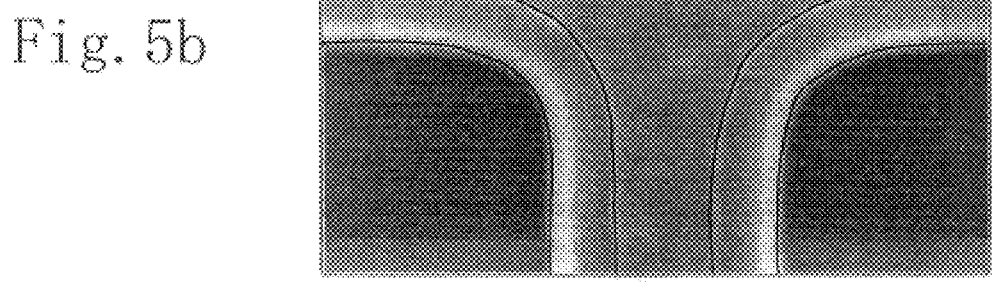
Figure 5C:
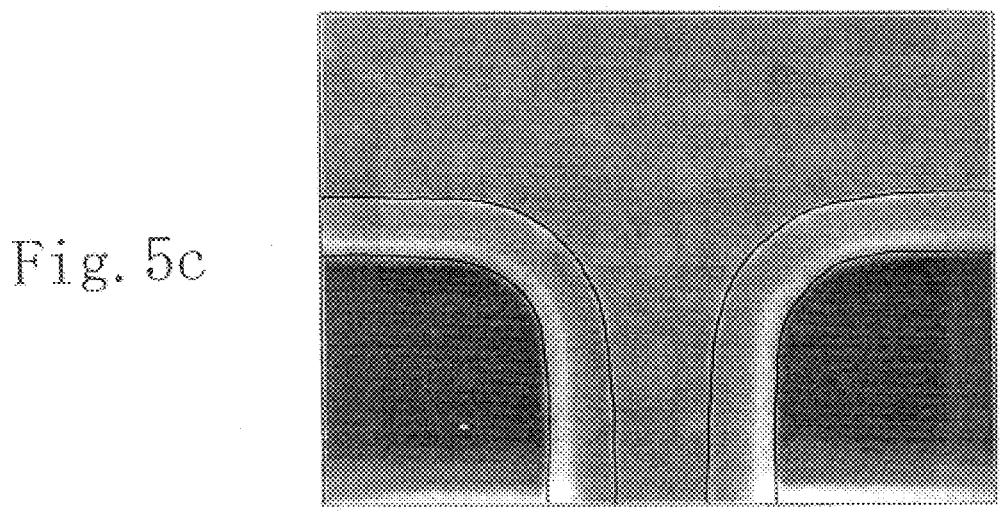

FIGS. 5(a) to (c) are photocopies of SEM images on the top surfaces of samples that have been subjected to RTA processes performed under three different conditions to verify the effects of the RTA processes in oxygen-containing atmospheres. On the top surfaces of the samples shown in FIGS. 5(a) to (c), there are appearing the gate electrodes composed of polysilicon, the sidewalls composed of the oxide films surrounding the gate electrodes, and the surfaces of the silicon substrates formed with the heavily doped source/drain regions.

FIG. 5(a) shows the state of the top surface of the sample that has been subjected to the RTA process during which only $N_2$ was allowed to flow at a flow rate of 5.0 slcm. FIG. 5(b) shows the state of the top surface of the sample that has been subjected to the RTA process during which the $N_2/O_2$ flow rate ratio was 5.0/0.3 slcm. FIG. 5(c) shows the state of the top surface of the sample that has been subjected to the RTA process during which the $N_2/O_2$ flow rate ratio was 5.0/20.0 slcm. As shown in FIG. 5(a), voids formed after the impurity has come out are present in the gate electrode composed of the polysilicon layer when the RTA process was performed while only $N_2$ was allowed to flow. By contrast, voids are not present in the gate electrode composed of the polysilicon layer when the RTA processes were performed while $N_2$ and $O_2$ were allowed to flow, as shown in FIGS. 5(b) and (c). Therefore, it has been proved that the out-diffusion of the impurity in the polysilicon layer can be suppressed positively by performing the heat treatment (RAT process in the present embodiment) in the atmosphere containing oxygen.

Figure 6:
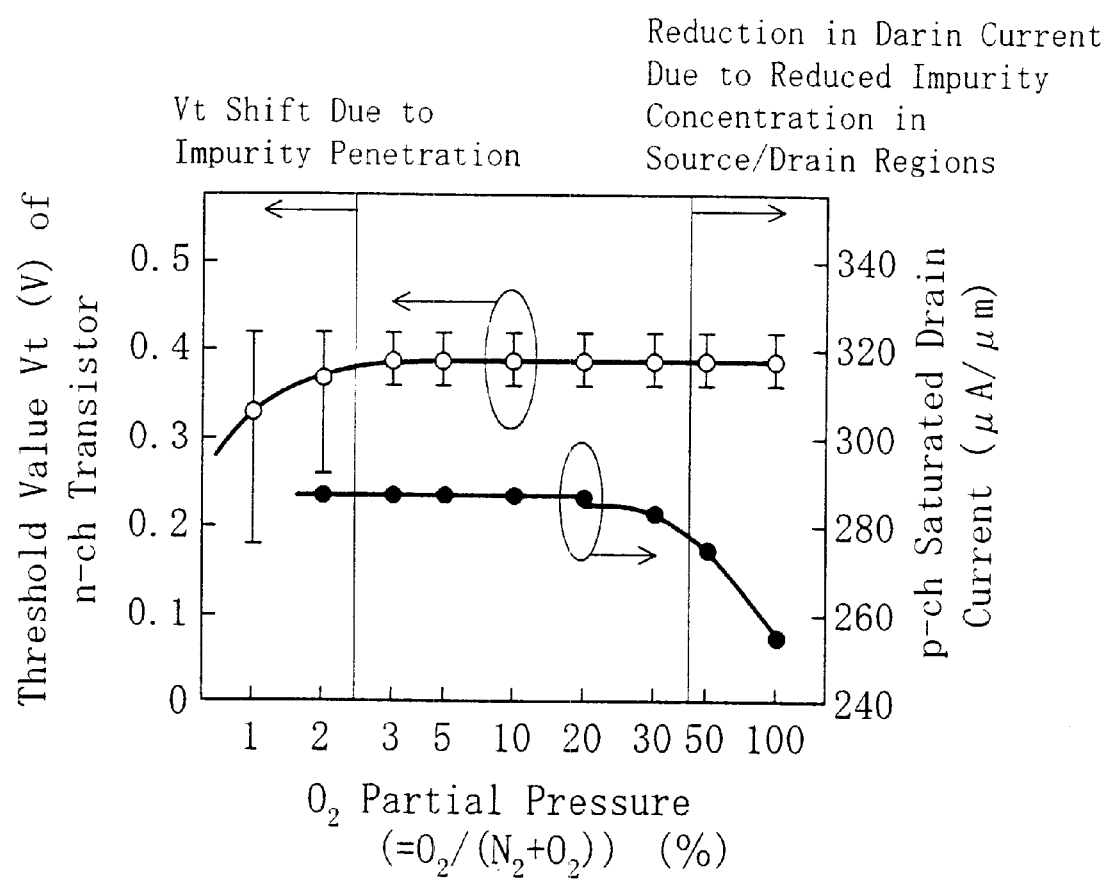
FIG. 6 is a view showing variations in the threshold voltage of an n-channel MOS transistor and a reduction in drain current due to a reduced impurity concentration in the source/drain regions of a p-channel MOS transistor, which are plotted against $O_2$ partial pressure during the RTA processes.

FIG. 6 is a view showing variations in the threshold voltage of the n-channel MOS transistor and a reduction in drain current due to a reduced impurity concentration in the source/drain regions of the p-channel MOS transistor, which are plotted against $O_2$ partial pressure during the RTA processes. In the drawing, the horizontal axis represents $O_2$ partial pressure $((O_2/(N_2+O_2)))$ and the vertical axis represents the threshold voltage (V) of the n-channel MOS transistor and the saturated drain current ($\mu A/\mu m$) of the p-channel MOS transistor. As shown in the drawing, the threshold voltage of the n-channel MOS transistor has undergone a shift when the $O_2$ partial pressure becomes 2.5% or lower and the saturated drain current in the p-channel MOS transistor has lowered significantly when the $O_2$ partial pressure exceeds about 40%. That is, the thicker oxide film is formed on the substrate as the $O_2$ partial pressure is increased, while boron as the p-type impurity in the source/drain regions is sucked out in a larger amount into the oxide film, so that the electric resistance in the source/drain regions is increased and the saturated drain current is reduced.

Figure 7:
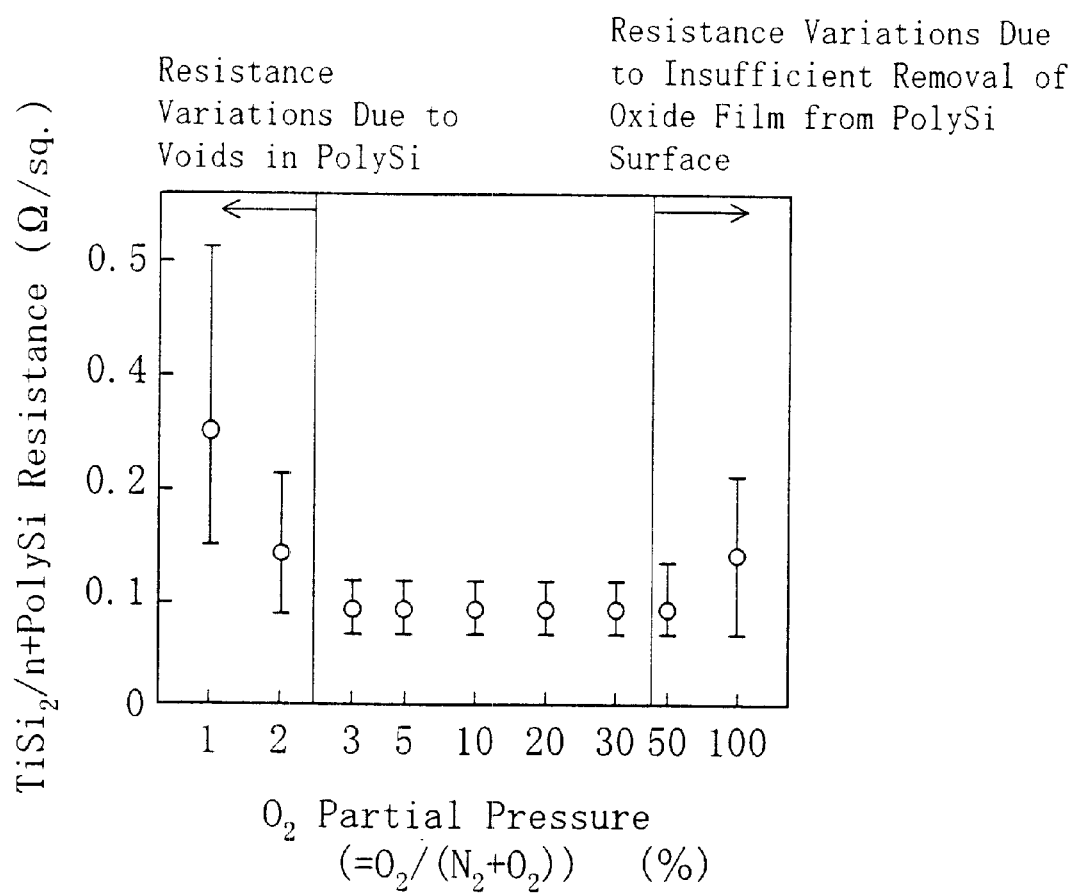
FIG. 7 is a view showing resistance variations due to formation of voids in a polysilicon layer and resistance variations due to insufficient removal of an oxide film on the polysilicon layer, which are plotted against $O_2$ partial pressure during the RTA processes.

FIG. 7 is a view showing resistance variations due to formation of voids in the polysilicon layer and resistance variations due to insufficient removal of the oxide film on the polysilicon layer, which are plotted against $O_2$ partial pressure during the RTA processes. In the drawing, the horizontal axis represents $O_2$ partial pressure $((O_2/(N_2+O_2)))$ and the vertical axis represents the sheet resistances ($\Omega/sq.$) of the silicide layer and the polysilicon layer. As shown in the drawing, the sheet resistances of the silicide layer and the polysilicon layer have varied significantly due to formation of voids when the $O_2$ partial pressure becomes 2.5% or lower and the oxide film on the polysilicon layer becomes thick when the $O_2$ partial pressure exceeds 40%. As a result, the sheet resistances of the silicide layer and the polysilicon layer due to insufficient removal of the oxide film vary significantly in the subsequent process. Since the provision of an additional step of removing the oxide film complicates the process, it is preferable not to provide the additional step of removing the oxide film, if possible.

As can be seen from the data shown in FIGS. 6 and 7, the $O_2$ partial pressure is preferably 2.5 to 40% and more preferably to 30%.

EMBODIMENT 3

FIGS. 8(a) and (b) and FIGS. 9(a) to (c) are cross-sectional views illustrating the process of fabricating a semiconductor device according to a third embodiment of the present invention.

First, prior to the step shown in FIG. 8(a), the same process as shown in FIGS. 2(a) to (c) according to the second embodiment is performed.

Then, in the step shown in FIG. 8(a), a TEOS film 10 is deposited by plasma CVD on the entire surface of the substrate. Although the first embodiment has performed annealing immediately thereafter, the present embodiment will not perform annealing.

Next, in the step shown in FIG. 8(b), a resist mask 24 covering the non-silicidation region Rnsi and having an opening over the silicidation region Rsi is formed on the TEOS film 10. Wet etching is performed by using the resist mask 24 as an etching mask, thereby removing the portion of the TEOS film 10 included in the silicidation region Rsi. As a result, a TEOS mask 10a covering the non-silicidation region Rnsi is formed and the respective surfaces of the source/drain regions 6 and gate electrode 8 of each of the MOS transistors in a silicide formation region Rsi are exposed.

It is to be noted that the second embodiment has washed away the resist mask 23 with the aqueous sulfuric peroxide solution (sulfuric acid+hydrogen peroxide+water).

By contrast, the present embodiment removes the resist mask 24 by performing ashing using an $O_2$ plasma in the step shown in FIG. 9(a) and then washing with an aqueous sulfuric peroxide solution (sulfuric acid+hydrogen peroxide+water). By performing ashing using the $O_2$ plasma, oxide films 32 are formed on portions uncovered with the TEOS mask 10a, i.e., on the gate 31 electrodes 8 and source/drain regions 6 of the MOS transistors in the silicide formation region Rsi. As a result, the oxide films 32 are also formed on the gate electrodes 8 in the pMOSFET formation region Rsp. This achieves the same effects as achieved in the second embodiment, which are the suppression of out-diffusion of the p-type impurity (boron) in the gate electrode 8 of the pMOS transistor during the RTA process and the prevention of As penetration by the subsequent ion implantation for preamorphous formation.

At that time, the temperature for ashing is in the range of 150 to 300° C.

Next, in the step shown in FIG. 9(b), ion implantation for preamorphizing the respective surface portions of the gate electrodes 8 and the heavily doped source/drain regions 6 in the silicidation region Rsi is performed for easy silicidation of the. surface portions of the gate electrodes 8 and the heavily doped source/drain regions 6. Specifically, arsenic ($As^+$) ions are implanted into the gate electrodes 8 and the heavily doped source/drain regions 6 by using the TEOS mask 10a as an implant mask at a dose of about $5\times10^{15}$ cm$^{-2}$ and an implant energy of about 20 keV. As a result, the respective near-surface regions of the gate electrodes 8 and the heavily doped source/drain regions 6 are amorphized and silicide is more likely to be formed. Since the dose for the ion implantation performed at this time is extremely low compared with the dose of ions implanted into the polysilicon film and the source/drain regions, the impurity implanted in the polysilicon film and the source/drain regions does not impair conductivity.

In addition, since an ion species implanted at this time is satisfactory provided that it has the function of amorphizing the regions to be silicided, the ion implantation may also be performed by using not only $As^+$ but also ions of relatively large atoms such as Ge.

Next, in the step shown in FIG. 9(c), a metal film composed of titanium (or cobalt film) and having a thickness of 50 nm is deposited over the entire surface of the substrate. At this time, a sputtering method using titanium (or cobalt) as a target is adopted.

Next, a heat treatment is performed at 650° C. for 30 minutes to cause reactions among titanium (or cobalt), polysilicon composing the gate electrodes 8, and monocrystalline silicon composing the heavily doped source/drain regions 6, thereby siliciding the respective surface portions of the gate electrode 8 and the heavily doped source/drain regions 6 and forming titanium silicide films 11a and 11b. Then, the unreacted metal film is removed.

The subsequent process is as described in the first embodiment. When the TEOS mask 10a is removed, n-channel and p-channel MOS transistors each comprising the gate electrode 8 and the heavily doped source/drain regions 6 having the respective surfaces portions thereof silicided are formed in the silicidation region Rsi. In the non-silicidation region Rnsi, high-breakdown-voltage n-channel and p-channel MOS transistors, each comprising the non-silicided gate electrode 8 and the heavily doped source/drain regions 6, and the non-silicided resistor film are formed.

The present embodiment can also achieve the same effects as achieved by the second embodiment by performing the first and second RTA processes in the atmosphere containing oxygen. Additionally, the present embodiment has formed the oxide films 32 on the gate electrodes 8, so that the high-temperature process such as an RTA process need not be performed in removing the resist mask 24 by ashing using the $O_2$ plasma. This offers the advantage that the adverse effect on the properties of the MOS transistors can be circumvented positively.

It is to be noted that the second RTA process is performed after the oxide films 32 shown in FIG. 9(a) are formed in order to activate the p-type impurity implanted in the resistor film 13 and in the gate electrode 8 of the p-type MOS transistor. In that case also, the present embodiment has the advantage that the oxide films 32 having optimum thicknesses can be formed under conditions irrelevant to the conditions of the RTA process.

It is also possible to perform the RTA for activating the impurity in the source/drain regions after the interlayer insulating film is formed.

VARIATION OF EMBODIMENT 3

In order to form the oxide films while removing the resist mask 24, the third embodiment has performed washing with the aqueous sulfuric peroxide solution (sulfuric acid+hydrogen peroxide+water) after performing ashing using the $O_2$ plasma (plasma oxidation) first. However, the sequence of performing washing and ashing may also be changed. That is, the oxide films 32 can be formed on the gate electrodes 8 and on the heavily doped source/drain regions 6 by an $O_2$ plasma process (plasma oxidation) after removing the resist mask 24 by performing washing with aqueous sulfuric peroxide solution (sulfuric acid+hydrogen peroxide+water). If the second RTA is performed thereafter, the out-diffusion of the impurity and the penetration of ions for preamorphization can be suppressed so that the same effects as achieved by the third embodiment are achievable.

OTHER EMBODIMENTS

Although the high-breakdown-voltage MOS transistor has been provided in the non-silicidation region Rnsi in each of the embodiments, the present invention is not limited to such an embodiment. The present invention is also applicable to the case where only the resistor is disposed in the non-silicidation region.

The present invention is also applicable to a structure in which the electrode of a capacitor (upper electrode) is disposed in the silicidation region Rsi or in the non-silicidation region Rnsi.

What is claimed is:

1. A method of fabricating a semiconductor device having a silicidation region and a non-silicidation region, wherein a MOS transistor comprising a gate electrode and heavily doped source/drain regions each having a silicided upper portion is disposed in the silicidation region, while an element comprising a polysilicon member having a non-silicided upper portion is disposed in the non-silicidation region, the method comprising the steps of:

(a) forming a gate insulating film and a polysilicon film on a semiconductor substrate;

(b) implanting ions of an n-type impurity for resistance reduction into a portion of the polysilicon film by using a mask having an opening corresponding to an n-type impurity implantation region;

(c) performing a first heat treatment for activating the n-type impurity;

(d) after the step (c), implanting ions of a p-type impurity for resistance reduction into another portion of the polysilicon film by using a mask having an opening corresponding to a p-type impurity implantation region;

(e) after the step (d), patterning the polysilicon film to form a gate electrode of the MOS transistor in the silicidation region and the polysilicon member in the non-silicidation region;

(f) implanting impurity ions for forming the heavily doped source/drain regions of the MOS transistor;

(g) after the step (f), forming an insulating film on the substrate;

(h) forming a selective etching mask on the insulating film;

(i) patterning the insulating film by using the selective etching mask to form a silicidation mask, the mask covering the non-silicidation region and having an opening over the silicidation region;

(j) after the step (i), performing a second heat treatment for activating the p-type impurity;

(k) after the step (j), implanting impurity ions for promoting silicidation into the gate electrode and heavily doped source/drain regions of the MOS transistor in the silicidation region; and (l) after the step (k), siliciding the respective upper portions of the gate electrode and heavily doped source/drain regions of the MOS transistor in the silicidation region.

2. The method of claim 1, wherein the first heat treatment is performed in an atmosphere containing oxygen.

3. The method of claim 2, wherein a partial pressure of oxygen in the atmosphere containing oxygen in the first heat treatment is 5 to 30%.

4. The method of claim 1, wherein the second heat treatment is performed in an atmosphere containing oxygen.

5. The method of claim 4, wherein a partial pressure of oxygen in the atmosphere containing oxygen in the second heat treatment is 5 to 30%.

6. The method of claim 1, wherein, in the step (h), the selective etching mask is formed of a resist film, the method further comprising the step of:

after the step (i) and prior to the step (j), removing the resist film by ashing using an oxygen plasma.

7. The method of claim 1, wherein, in the step (h), the selective etching mask is formed of a resist film, the method further comprising the step of:

after the step (i) and prior to the step (j), removing the resist film by using an aqueous solution of sulfuric acid and hydrogen peroxide and plasma oxidizing the respective surface portions of the gate electrode and the heavily doped source/drain regions in the silicidation region.

8. The method of claim 1, wherein, in the step (b), at least one of a resistor film of a resistor and a gate electrode of a high-breakdown-voltage transistor is formed as the polysilicon member of the element in the non-silicidation region.

9. A method of fabricating a semiconductor device, the method comprising the steps of:

(a) implanting ions of an impurity for resistance reduction into polysilicon layer on a semiconductor substrate; and (b) after performing step (a), forming an oxide film on the polysilicon layer by performing a RTA treatment as a heat treatment, with respect to the substrate in an atmosphere containing oxygen having an adjusted pressure of oxygen between 2.5% to 40%, and nitrogen.

10. The method of claim 9, wherein the polysilicon layer is a resistive element of a resistor.

11. The method of claim 9, wherein the oxide film is formed with a thickness between 3 to 4 nm.

12. A method of fabricating a semiconductor device, the method comprising the steps of:

(a) implanting ions of an impurity for resistance reduction into a polysilicon layer of a gate electrode of a MOS transistor on a semiconductor substrate;

(b) after performing step (a), performing a heat treatment with respect to the substrate in an atmosphere containing oxygen;

(c) after performing step (b), implanting an impurity for promoting silicidation into the polysilicon layer; and (d) after performing step (c), siliciding an upper portion of the polysilicon layer.

13. The method of claim 12, wherein the heat treatment is performed by a RTA treatment.

14. The method of claim 13, wherein the RTA treatment is performed in an ambient containing oxygen having an adjusted pressure of oxygen between 2.5% to 40%, and nitrogen.

15. The method of claim 12, wherein the heat treatment is performed by ashing of $O_2$ plasma.

16. The method of claim 15, wherein the temperature of ashing is between 150° C. to 300° C.

17. The method of claim 12, wherein the surface portion of the polysilicon layer is amorphousized due to the implanting of the impurity for promoting silicidation.

* * * * *